United States Patent
White et al.

(10) Patent No.: US 6,847,433 B2
(45) Date of Patent: Jan. 25, 2005

(54) HOLDER, SYSTEM, AND PROCESS FOR IMPROVING OVERLAY IN LITHOGRAPHY

(75) Inventors: Donald L. White, Morris Plains, NJ (US); Obert Reeves Wood, II, Little Silver, NJ (US)

(73) Assignee: Agere Systems, Inc., Allentown, PA (US)

( * ) Notice: Subject to any disclaimer, the term of this patent is extended or adjusted under 35 U.S.C. 154(b) by 13 days.

(21) Appl. No.: 10/159,268

(22) Filed: Jun. 3, 2002

(65) Prior Publication Data

US 2003/0081193 A1 May 1, 2003

Related U.S. Application Data

(60) Provisional application No. 60/294,566, filed on Jun. 1, 2001.

(51) Int. Cl.[7] .................. G03C 5/00; G03B 27/32; G03B 27/58
(52) U.S. Cl. .................. 355/72; 355/67; 355/69; 355/77; 430/22; 430/30; 430/967; 250/491.1; 250/492.1; 250/492.2; 250/492.22; 250/519.1
(58) Field of Search ............... 250/491.1, 492.1, 250/192.22, 192.2, 519.1; 355/67, 69, 72, 77; 430/22, 30, 967

(56) References Cited

U.S. PATENT DOCUMENTS

| | | | | |
|---|---|---|---|---|
| 4,385,434 A | * | 5/1983 | Zehnpfennig et al. ... | 250/492.2 |
| 4,760,265 A | * | 7/1988 | Yoshida et al. .......... | 250/492.2 |
| 5,420,436 A | * | 5/1995 | Seya et al. ............... | 250/492.1 |
| 6,093,511 A | * | 7/2000 | Tanaka et al. ........... | 430/30 |
| 6,219,130 B1 | * | 4/2001 | Kawakubo ............... | 355/67 |
| 6,414,326 B1 | * | 7/2002 | Nguyen ................... | 250/492.2 |
| 6,556,281 B1 | * | 4/2003 | Govil et al. .............. | 355/72 |
| 2002/0011573 A1 | * | 1/2002 | Van Dijsseldonk et al. ...... | 250/492.22 |
| 2002/0105628 A1 | * | 8/2002 | Saito et al. .............. | 355/69 |

* cited by examiner

Primary Examiner—John R. Lee
Assistant Examiner—Bernard Souw

(57) ABSTRACT

A deformable holder, system, and process where long range errors (any of lithography, metrology, or overlay errors) between the image of a mask and an existing pattern on a wafer from a number of potential sources are corrected. The long range errors are determined using either a through-the-lens alignment metrology system or an around-the-lens metrology system. Deformation values are determined to compensate for the longe range errors. The deformation values are determined by either solving simultaneous equations or by finite-element linear-stress-analysis (FEA). The mask or wafer is then distorted, in-plane, by an amount related to the determined deformation values using an actuator such an a piezoelectric ceramic to push or pull the mask or wafer to substantially realign the projected image of the mask and the existing pattern on the wafer.

35 Claims, 8 Drawing Sheets

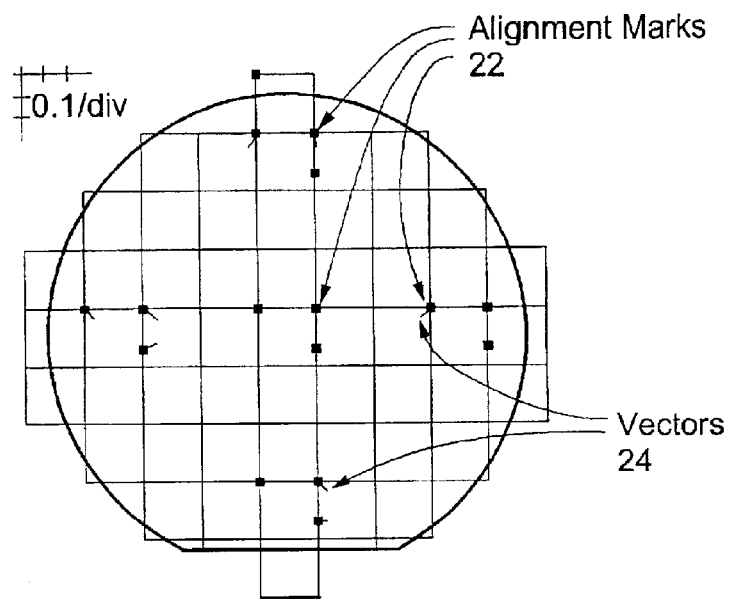
FIG. 2(a)
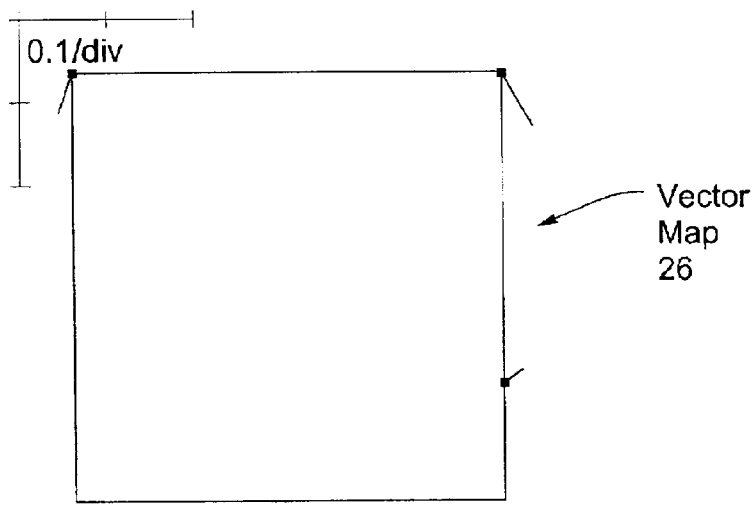
FIG. 2(b)
FIG. 2(c)
Mean X UL: -0.012 μm
Mean Y UL: -0.042 μm
Mean X UR: +0.030 μm
Mean Y UR: -0.059 μm
Mean X LR: +0.019 μm
Mean Y LR: +0.014 μm

HOLDER, SYSTEM, AND PROCESS FOR IMPROVING OVERLAY IN LITHOGRAPHY

This application Ser. No. 10/159,268 claims priority from Provisional Application Ser. No. 60/294,566, filed on Jun. 1, 2001.

TECHNICAL FIELD

The present invention relates to the field of VLSI lithography, and more particularly to lithographic overlay.

BACKGROUND ART

As the demand for products with finer and finer features increases, alignment and overlay is becoming more difficult and product failure due to misalignment is becoming more prevalent. Even when the alignment metrology is perfect and the measured misalignment of an alignment mark near a chip is very small, distortion in the projected image of the mask due to mask writing errors and lens aberrations and in the wafer due to internal strains from prior processing steps can ultimately limit the alignment accuracy.

There are numerous sources of potential distortion in a mask pattern or in its projected image (if it is a photomask) relative to an existing pattern on a silicon wafer. Some of these sources and their properties are described below.

The electron beam (e-beam) tool used for mask patterning may make mistakes during the write step. Fortunately, in a typical projection lithography tool, the mask pattern is four times larger than the wafer pattern and small, discrete errors, such as a missing micron of chrome, can be corrected by ion implantation. However, long-range errors, such as an entire segment of a mask being displaced (by 0.25 microns for example) cannot be corrected and, if out of tolerance, the mask must be discarded. Mask writing errors vary from mask to mask, and thus each mask must be inspected. To significantly reduce mask writing errors below current levels would greatly increase mask costs. Further, the processing of a photomask may introduce strains (mask strain) in its fused-silica substrate and, hence, lead to pattern distortions.

Wavefront errors in the projection lens also may distort the projected image. This is called lens distortion. Distortion often limits the maximum field size a lens can project. In many cases the image is best near the optic axis and deteriorates at increasing radii. In scanning systems, some of the lens distortion tends to be averaged out, but at the price of a fuzzy line edge. If the same lens is used to make both the wafer pattern and the projected image of the mask, the lens distortions will be almost identical and will not lead to significant overlay errors. However, if different lenses are used for the two lithographic levels, lens distortion can be a significant problem.

Further, the silicon wafer may be distorted in x and y (affecting alignment) and z (affecting focus) during processing steps such as, heating, cooling, and the removal or addition of material under stress. These distortions vary greatly from wafer to wafer in different lots and even to some extent from wafer to wafer within the same lot. U.S. Pat. No. 5,094,536 to MacDonald et al. discloses a system where a wafer chuck is distorted in the z direction. In MacDonald et al., vertical distortions in the wafer (distortions out of the plane of the wafer surface) are corrected using piezoelectric actuators to increase the depth of focus. Other techniques, such as grinding the wafer to achieve a high degree of smoothness and pulling the wafer flat with a vacuum chuck, have also been used to reduce out-of-plane distortions. A wafer with significant out-of-plane distortions may be covered with a smooth, flat organic layer which is then covered with the photoresist—since the resist is on a flat surface, the projected image will be in focus over the whole wafer. It is noted that out-of-plane distortions may introduce some lateral distortions because the wafer is stretched when pushed out of plane.

Still further, the translation and rotation stages are not perfect and can position the wafer in slightly the wrong place. In a scanning system, the mask position is also subject to stage error.

In every level but the first, the projected image of the mask is aligned to a previous lithographic level on the wafer. Each chip on a particular level is subject to all of the errors, described above, produced during the printing of that level. Since the mask errors at two different levels can be drastically different, the error between the projected image (the current level) and the wafer pattern (a previous level with a different mask) can be significant.

Distortions can also be created by a chuck that is not holding the wafer (or mask) properly, by temperature effects, or by other environmental factors. In practice, many distortions are found to vary continuously, some across the whole wafer and some only across a chip. Still others vary discontinuously from chip to chip. To compensate for such distortions, sufficient misalignment information must be acquired to make an accurate distortion map of the mask/wafer system.

A case where a projected image of the mask and the existing pattern on the wafer are squares of equal size is a good example. If the two squares do not overlap, they can be brought into alignment simply by moving the mask or the wafer stage. If, however, distortion is present and one of the squares is actually a parallelogram or a square of a different size, the two shapes cannot be made to overlap by stage motions alone because their shapes are not congruent. While it is possible to bring part of the patterns into alignment, it is impossible to achieve alignment over the entire image field.

The same overlay problems exist in other types of lithography in which there is no projection lens and hence, no projected image. In these types of lithography, the mask itself is aligned with the pattern on the wafer. An example is nano imprinting, a sub-50 nm lithography technique, in which the resist pattern is directly stamped on the wafer. Optical contact printing, proximity printing, and x-ray proximity printing are all lensless lithographic techniques that may suffer the same overlay problems.

SUMMARY OF THE INVENTION

The present invention provides a holder that can deform a mask or wafer in such a way that much of the image of the mask has a distortion almost identical to the distortion of the pattern on the wafer, and thus the mask image overlays the pattern on the wafer with little misalignment in the exposure field.

Here, the term image is used in the broad sense—a copy of an original mask pattern. The image could be an image of a mask projected by a lens as in photolithography or it could be a copy of a mask generated by a contact printing method. It is noted that the distortion itself need not be cancelled. The mask is distorted such that the image projected on the wafer has substantially the same distortion as the wafer pattern, thus, the distortion differences between the projected image and the wafer pattern are reduced. As set forth above, the image of the mask may refer to nano imprinting masks (also called molds) or to the projected image produced by a lithography technique, such as photolithography or extreme ultraviolet (EUV) lithography.

The present invention also provides a process for determining misalignment due to errors from a plurality of sources between the image of a mask and an existing pattern on a wafer, determining deformation values to substantially cancel the misalignment, and deforming the mask and/or the wafer in accordance with the deformation values to substantially realign the projected image of the mask and the existing pattern on the wafer.

The present invention also provides a lithographic system including a sub-system for determining misalignment due to errors from a plurality of sources between the image of a mask and an existing pattern on a wafer, a computer or other processor for determining deformation values to substantially cancel the misalignment, and a holder for deforming the mask and/or the wafer in accordance with the deformation values to substantially realign the projected image of the mask and the existing pattern on the wafer.

The present invention corrects overlay errors between the image of the mask on a wafer and a previously existing pattern on the wafer by laterally distorting (i.e., causing in-plane distortions parallel to a surface) the mask or the wafer.

The present invention can correct for in-plane distortions, such as lateral swelling or shrinking due to localized processing (e.g., metal deposited at high temperature can cause shrinkage when cooled to room temperature) or image distortions due to errors in the mask or projection lens.

The various embodiments of the present invention are particularly beneficial if the distortion is such that some or all alignment marks can not be brought into registration simultaneously by conventional x-y translations and rotations.

The adaptive mask holder or adaptive wafer chuck of the present invention use actuators that apply forces and thus deform the mask or wafer in the x-y plane to achieve alignment. Since the mask must remain transparent, actuators apply force to the edges of a mask. Since the wafer is opaque, lateral forces can be applied anywhere on a wafer. In EUV lithography the mask is opaque to EUV radiation (it is a reflective mask) and thus the actuators can be applied to both the edges and the back of the mask.

There are many types of actuators. Piezoelectric, electrostrictive, or magnetostrictive actuators are preferred because of their speed. However, there are other types driven by thermal expansion, motorized micrometers, etc. that are also usable in the present invention It is also noted that the term "optical" refers to all electromagnetic radiation including optical, ultraviolet (UV), deep UV, extreme UV (EUV), and x-ray radiation.

BRIEF DESCRIPTION OF THE DRAWINGS

FIG. 2(a) illustrates a vector map of the x and y-offsets on a typical wafer.

FIG. 2(b) illustrates one exposure field representing an average of the five measured fields.

FIG. 2(c) illustrates numerical values for the x and y-offsets of the average exposure field at the upper left (UL), upper right (UR) and lower right (LR) alignment mark locations.

DETAILED DESCRIPTION OF THE PREFERRED EMBODIMENTS

Figure 1A:
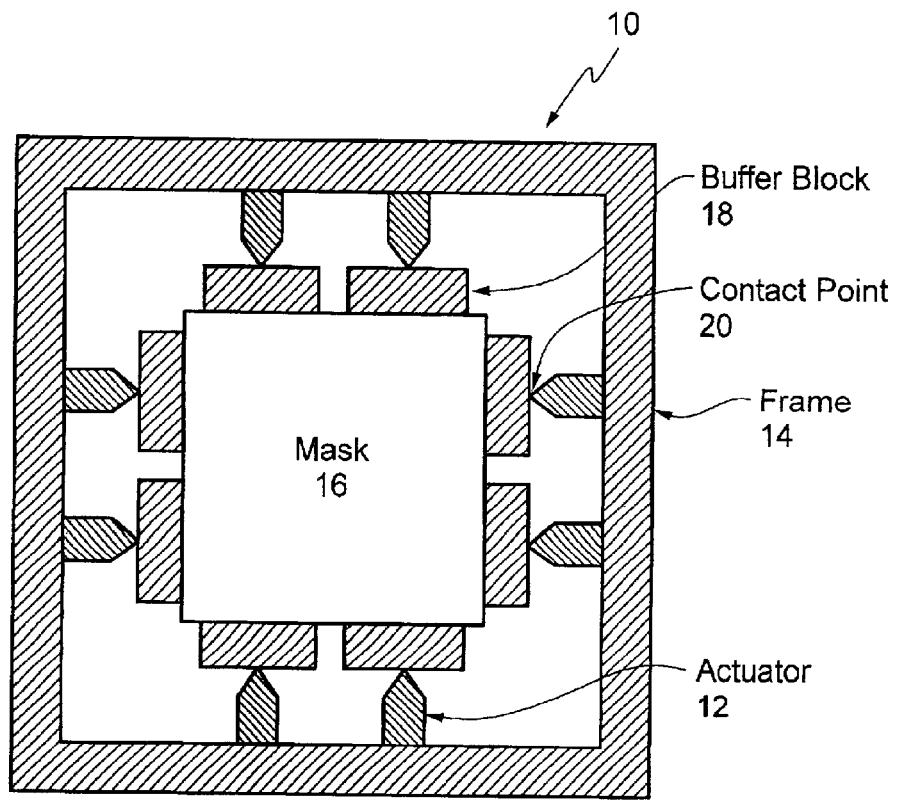
FIG. 1(a) illustrates a holder for a fused-silica photomask showing the location of piezoelectric actuators and stress uniformizing buffer blocks when undistorted.

The present invention is generally directed to an adaptive mask holder that uses actuators to apply force to one or more sides of a mask to produce a controlled deformation of the mask that cancels misalignment due to the distortion that is observed between the projected image of the mask and an existing pattern on a wafer.

The present invention is applicable to photolithography. The present invention is also applicable to other lithography types, for example, deep UV and EUV projection lithography and to nano-imprinting techniques. There is no lens in nano-imprinting—the mold, which applies a pattern directly to the wafer, is deformed to match the distortions in the pattern printed on the wafer. The present invention is also useful for overlay and metrology applications.

As described herein, a tool is defined as a machine that uses a mask for some purpose. In VLSI lithography, an image of the mask is recorded on the wafer—thus an EUV scanner step and scan projection camera including for example, a EUV source and condenser, mask, holder, lens, wafer holder, alignment system and wafer transport system is a tool that projects a 13.6 nm EUV image on a wafer coated with radiation sensitive resist.

In metrology, the pattern on the mask is often used as a standard against which other patterns are compared. The metrology tool provides the optics, lasers, transport stages, etc. which make such comparisons possible. For example, in an optical comparator a test piece is compared to a standard. For example, a VLSI mask may be inspected by comparing it optically against a known perfect mask and differences between the two are defects in the work piece.

Most inspection tools often inspect a mask for long range errors by determining the x-y coordinates of a number of points in the mask. This may be done with a laser interferometer controlled stage transport system that has a wellcalibrated stage positioning. Long range errors can also be detected with an optical comparator that compares images. Long range errors include whole segments of the pattern being displaced from their ideal coordinates. The pattern itself may be perfect (i.e. have no short range errors) but is positioned in the wrong place. In metrology, long range location of features must be know with precision.

As described herein the term mask is used as a generic term for the physical plate upon which a pattern is printed. The term vehicle is considered synonyms with the term mask. The mask pattern is the original source of the pattern used in the work. The ultimate source of the pattern is usually the software an e-beam writer sues to create the mask. In lithography the mask pattern is transferred to the wafer by projection, stamping (imprinting), contact printing, etc.

In metrology, the mask is often a used as a standard and observed directly. The mask may be used to calibrate a tool, such as distortion I a projection lens. There are several types of masks. Long range errors can be corrected by pre-distorting the mask, as described below.

In a holographic device, an image is reconstructed on a resist to write a pattern or on a photocell to read a memory. In a holographic system, long range errors add noise and false bits to the reconstructed image. By predistorting the mask containing the holographic pattern so the pattern is closer to the theoretical ideal, the reconstructed image will have much lower noise.

A plate (i.e. mask) used as a reference in metrology typically has features separated by very precise distances. Long range errors in these separations due, for instance to writing errors, can be corrected by predistorting the mask by placing the mask in a holder capable of introducing precise distortions. The mask can then be used in the distorted state while held in the special holder, or by making a replica of the distorted (but accurate) mask by contact printing, imprinting, etc.

Long range errors are defined as a continuous slowly varying displacement of features over the face of the wafer or mask. The distorted region may be a significant fraction of the whole pattern. Long range errors may be caused by thermal effects, release of built in strains during processing, aberrations in projection lenses, or failure in the tools used to generate the patterns. Long range errors are often found by comparing the measured distance between features to the ideal distances between the features. These displacements can be categorized as strains in the material, e.g. the distance between the features ideal 1 cm apart is actually 1.00001 cm apart, corresponds to a strain of 10 parts per million (10–5). If the mask is being used in a sub-tenth micron lithography, the error would be larger than the line width. If the mask is being used in a quarter micron lithography this may be tolerable, but in a tenth micron lithography it would be fatal.

Long range errors in the image projected on the wafer may include masks errors and projection lens errors. Long range errors in the existing pattern on the wafer may include projection errors from masks of previous levels and projection lens errors from lenses used in previous lithographic levels plus wafer errors due to wafer processing and the transport system of the camera.

In VLSI processing, the projected image of the mask should overlay the existing images on the wafer as perfectly as possible. For economic reasons, as many good VLSI chips per hour as possible should be produced. This means a certain percentage of failure is tolerable if the throughput of product is high.

The first steps to produce overlay is to adjust an x and y position of the wafer, via a transport system, to bring the alignment marks into registration. As alignment requirements get more severe, overlay is often improved by always using the same lens for all lithographic levels. This means the distortion in both the wafer and the projected image due to the projection lens will always be the same, and there are no overlay errors due to the projection lens. This gives some improvement in alignment, or allows one to use cheaper lenses.

The next step is to measure the distortions in the projected image and then use this invention to predistort the mask such that a perfect image is projected on the wafer. Note that distorting the mask alone can compensate for distortion in both the mask and the projection lens. All the lithographic levels, including the first, were printed with a perfect projected image, overlay will be improved. Note also that the same lens need not be used for all levels—the predistortion in the mask can be changed to accommodate the specific lens errors from different lenses.

If the pre-existing pattern on the wafer is already distorted, it is common that each chip has its own distortion, but there is often an average distortion that is similar for most of the chips. By studying the distortion of a few chips, say five or seven, an average distortion is found. The mask is then distorted so that projected image has this average distortion, that in general provides a better overlay than would a perfect projected image. In this strategy, the average distortions of the chips for a particular level are matched and overlay is improved.

However, the component of chip distortions that deviate from the average and also long range distortions that extend over several chips are not addressed. The distortion of each chip is either measured, or, by measuring a number of chips, the distortions of intermediate chips is calculated by extrapolation. In all cases the distortions in each chip may be different from each other, and for each shot (exposure of a chip) in the step and repeat or step and scan camera, the mask is distorted to compensate for mask and projection lens distortions (as above) plus the known distortions in the chip pattern on the wafer. In a step and repeat camera, the whole mask is distorted by the holder. In a step and scan camera only the part of the mask actually being projected at a particular moment need be distorted, but since the mask scans at high speed, the holder causing the distortions must be fast.

Mask errors are defined as errors in the actual pattern recorded on the mask plate. These are often errors printed into the resist by incorrect e-beam writing and errors that occur when the e-beam resist pattern is developed and transferred to a film on the mask plate.

Projection errors are defined as errors introduced to the image of the mask by the lens used to project an image of the mask onto a substrate, usually a photoresist coated wafer.

Wafer errors are defined as errors in the pre-existing pattern on the wafer due to previous lithographic levels. This may include effects of wafer distortion due to processing, projection errors in previous lithographic levels, and errors in the transport stages used to move the wafer.

An exemplary adaptive mask holder 10, with two actuators 12 on each side, is shown in FIGS. 1(*a*)–1(*b*). The adaptive mask holder 10 may include a frame 14 to hold the mask 16. To ensure that the stresses applied to the mask 16 are substantially uniform, the force from an actuator 12 may be applied to a small area of a hard stiff buffer block 18 in such a way that the contact point 20 between the actuator 12 and the buffer block 18 can pivot. Using actuators 12 in tension as well as compression enables a wide variety of mask deformations, such as changing the size of a square mask, deforming a square mask into a rectangular mask, a parallelogram mask, or a trapezoidal mask (illustrated in FIG. 1(b)), or rotating the mask in either direction. In general, the kinds of deformations that can be produced with an adaptive mask holder 10 of the type shown in FIG. 1 can change continuously and monotonically, i.e., the surface displacements may continuously increase or decrease across the mask 16.

Figure 1B:
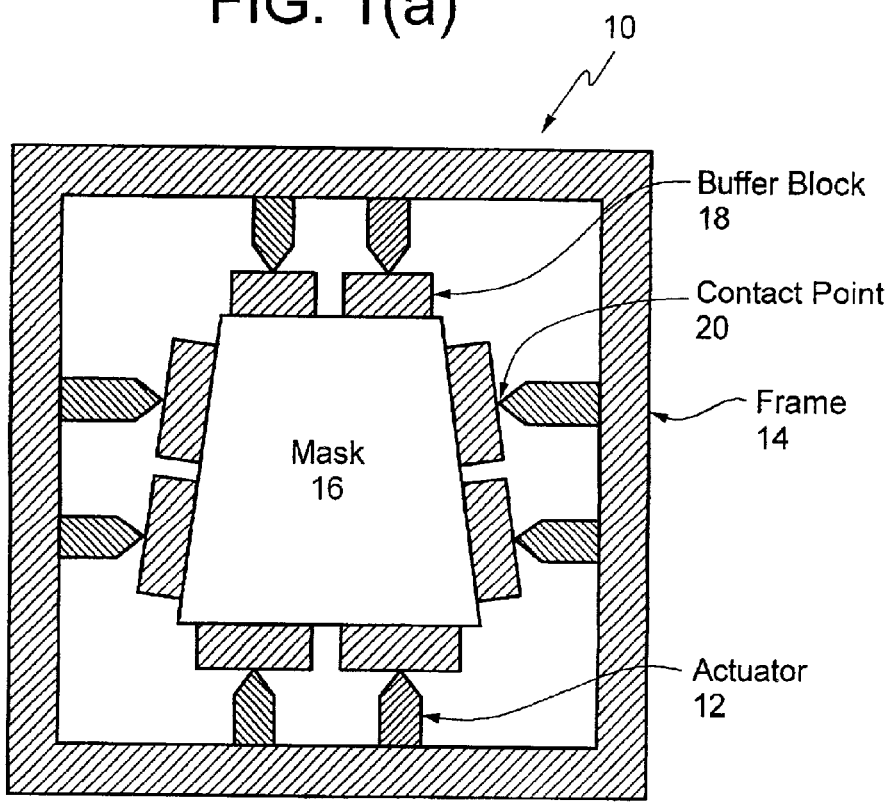
FIG. 1(b) illustrates producing a trapezoidal distortion in the horizontal direction.
Figure 1C:
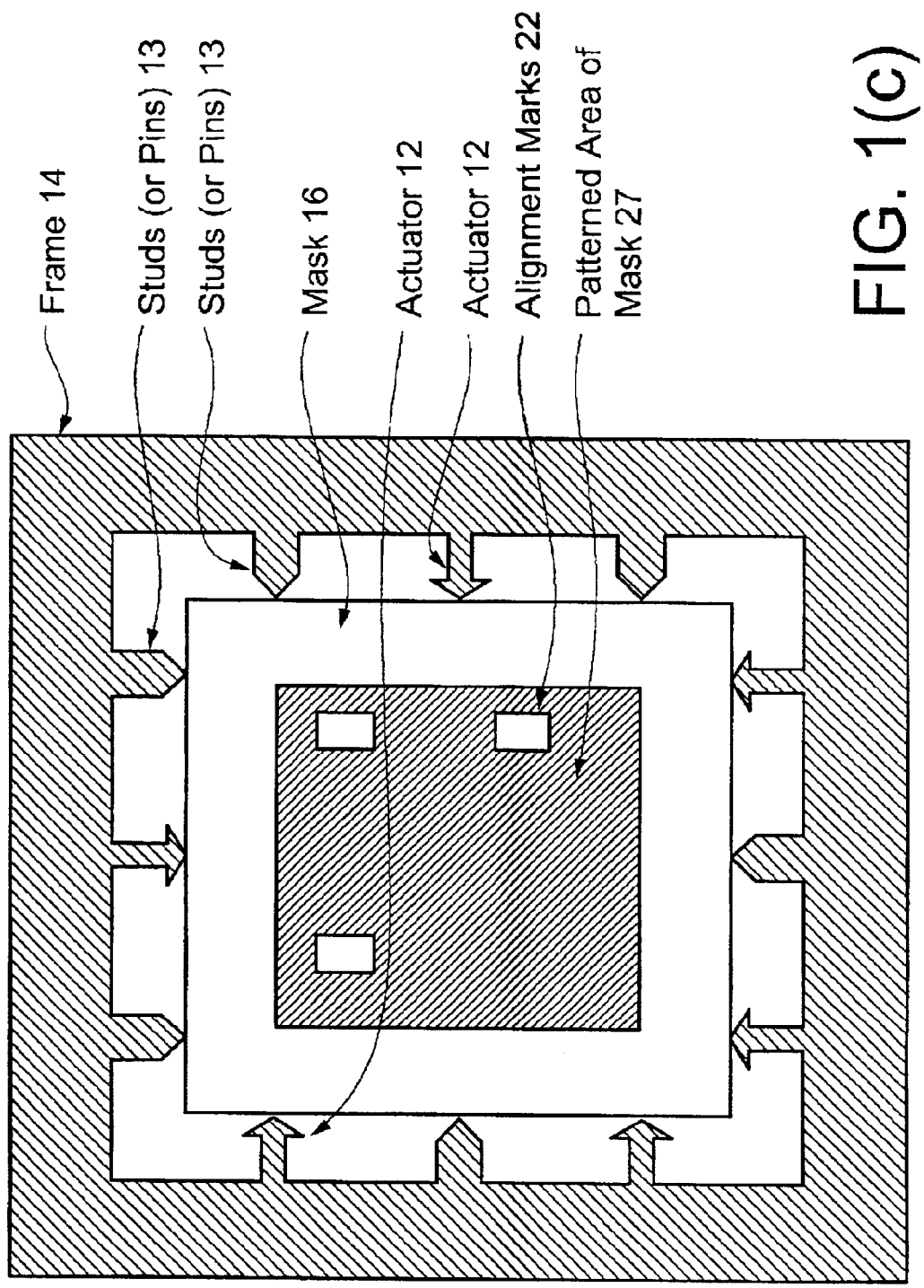
FIG. 1(c) illustrates an alternate arrangement including actuators and holding pins.

An arbitrary mask deformation can be more easily obtained when many actuators are used. In FIGS. 1(a) and 1(b) each actuator 12 is opposed by another actuator 12. However in FIG. 1(c) the force opposing the actuator 12 is a fixed stud or pin 13. Using a stud or pin 13 instead of another actuator 12 may complicate the calculations that determine the deformations that should be applied to the mask 16, but there may be an economic advantage in cost and in reliability.

Figure 1D:
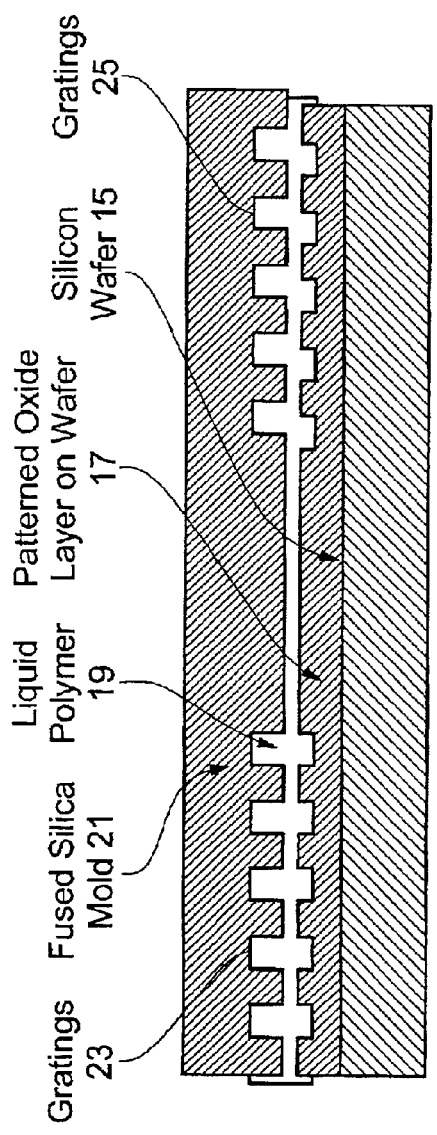
FIG. 1(d) illustrates a cross section of a patterned nano-imprinting mold pressed against a patterned wafer.
Figure 1E:
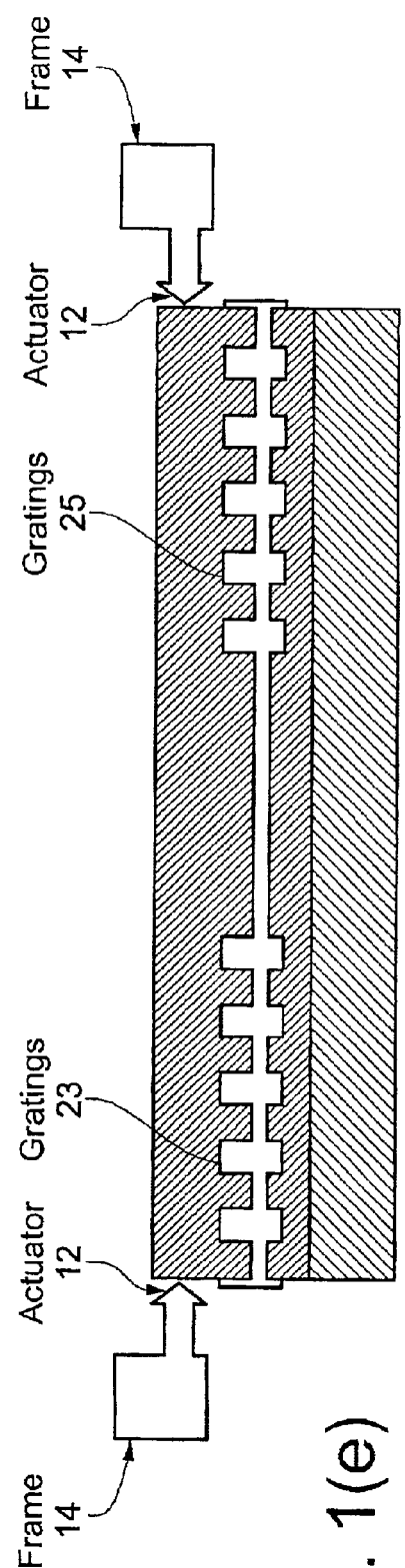
FIG. 1(e) illustrates the mold of FIG. 1(d) being compressed by an actuator to bring both gratings into alignment.

FIG. 1(d) illustrates a cross section of a patterned nano-imprinting mold pressed against a patterned wafer. FIG. 1(d) illustrates a wafer 15, a patterned oxide layer 17, a liquid polymer 19, and a fused silica mold 21. The gratings 23 on the left are aligned but the gratings 25 on the right are missaligned. FIG. 1(e) illustrates the mold of FIG. 1(d) compressed by an actuator 12 to bring both gratings 23, 25 into alignment.

It is noted that the arrangements in FIG. 1 are only exemplary. For example, the mask 16 of FIG. 1(a) need not be square and there may be more or less than two actuators 12 and/or blocks 18 per side.

In cases where a mask 16 can only be squeezed from its edges, not all deformations are possible. For example, the induced deformations cannot have a strong compression in the center of the mask 16 and tension on the periphery. To achieve such a strain pattern in a mask, forces should be applied to the mask center, not just to the mask edges. A photomask is used in transmission, so no actuators 12 can be applied to the center. Because EUV masks are used in reflection, not transmission, actuators 12 may be applied to the back of an EUV mask as well as to the edges. Furthermore, a more complex strain pattern could also be produced in a silicon wafer by placing actuators on the back of the wafer. The actuators would deform the wafer such that displacements are produced in the plane of the wafer surface. Distorting the wafer can produce alignment of all lithographic systems, even those that require transparent masks. However an adaptive wafer holder has many actuators, making it much more expensive, and there is difficulty in attaching the actuators to the wafer—using vacuum chucks, but the maximum force that can be applied to the wafer is limited.

In practice, actuators 12 that compress a mask 16 can be easily employed. In order for actuators 12 to apply tension, the actuators 12 could be bonded to the fused-silica mask substrate, but may inhibit rapid mask changes, cause local strains as the adhesive cures, increase particulate production and increase mask costs. Gripping the mask at the edges with a clamp also has very undesirable side effects. Thus, in its neutral state the mask 16 should be compressed. If the required deformation calls for tension, the compression can be reduced, but should not be reduced to the point where the actuator 12 is no longer in contact with the mask 16. The residual strains due to distortion are usually less than ten parts per million, which corresponds to 0.2 microns across a 20 mm chip. Thus, it is possible to insert a mask 16 into the adaptive mask holder 10 by pulling the actuators 12 back mechanically or by applying a voltage that would make the actuators 12 shrink so that the mask 16, in is neutral state is compressed from all sides by, for example, 20 parts per million. In this case, a projection lens could be adjusted to give an extra 20 parts per million magnification so that the final image projected on the wafer has the proper size.

As described above, it is not feasible to measure the misalignment at all points in a mask/wafer system. Alignment measurements can only be made at those locations that have alignment marks. Since alignment measurements take time, and time spent on tasks other than printing reduces throughput, the time spent making alignment measurements should be reduced. One way of reducing the number of measurements necessary is to measure a few sites and compute the distortion at other sites by interpolation. Accurate interpolation requires that the general pattern of both intra-field and inter-field (or whole-wafer) distortion be known. For example, the distortion introduced by a projection lens in most cases is available from the lens manufacturer. Further, the distortion remains unchanged unless the lens suffers some trauma and its effect will be identical for every chip on the wafer.

Similarly, mask-writing and mask-strain errors will occur in every chip that uses a particular mask, but these can be accurately measured in advance. The voltages applied to the adaptive mask holder 10 when printing the previous level can be recorded, so the major part of the intra-field distortion on the wafer should be known. Similarly, the long-range distortions in the wafer's previous level should also be known. The distortion added during the processing of the previous level is the difference between the measured misalignment and the misalignment computed from the distortions just described. If this difference is small, then the computation of the distortions at unmeasured sites by interpolation will be fairly accurate.

In current practice, the lead wafer in a lot is exposed and the resulting overlay errors between the mask and wafer patterns are measured offline (at, typically, three sites per exposure field and five exposure fields per wafer) with an overlay metrology tool such as the Bio-Rad Model Q200. The three measurements at each chip give information about the distortion within a chip. The information from the five separate chips allows an alignment system computer to calculate the overall or long range distortion in the wafer. Alignment marks 22 and vectors 24 of the x and y offsets of a typical device wafer recorded with an overlay metrology tool are shown in FIG. 2(a). The map of FIG. 2(a) was produced with a Bio-Rad Model Q200 Overlay Metrology Tool showing five exposure fields. The map of FIG. 2(a) shows that there are long-range distortions that vary continuously over the whole area of the wafer (as indicated by the left/right asymmetry evident in the center row of exposures) as well as errors localized to the individual chips. Long range distortions may be caused by stresses in the patterning layers, thermal gradients over the wafer during processing, systematic errors in the x-y stages, differences in speed between the mask and wafer in a scanner, etc. A vector map 26 of the average x and y offsets for all five fields are shown in FIG. 2(b). The vector map 26 shows that each site within a single exposure field can be quite different and that a single x-y wafer displacement can not bring all three sites into alignment simultaneously. Although the above describes three sites per exposure field and five exposure fields per wafer, the number of readings per chip as well as the number of chips may vary.

The deformations required to cancel the measured misalignments at three sites in an exposure field can be computed analytically by solving six simultaneous equations involving the six known displacements, e.g., the x and y misalignments at the three alignment mark sites shown in FIG. 2(b), and the six unknown orthogonal strains (magnification, shear and trapezoidal distortion in the x and y directions). Once the strains required for alignment are known, the proper voltages can be applied to the piezoelectric actuators 12 in the adaptive mask holder 10 to create the known strains and bring the mask 16 and wafer into alignment simultaneously at all three alignment marks 22.

Figure 3A:
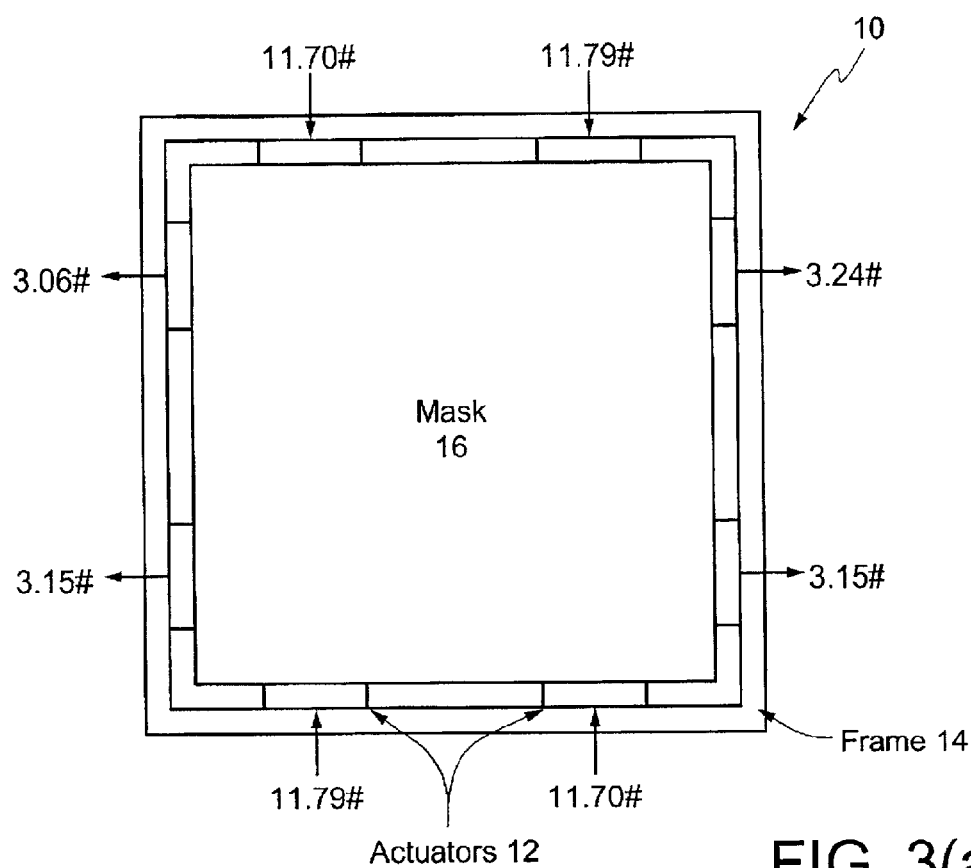
FIG. 3(a) illustrates an adaptive mask holder for a 5"×5"×0.090" thick fused-silica mask showing the forces required to produce x and y surface displacements that reproduce the x and y offset data shown in FIG. 2(c).
Figure 3B:
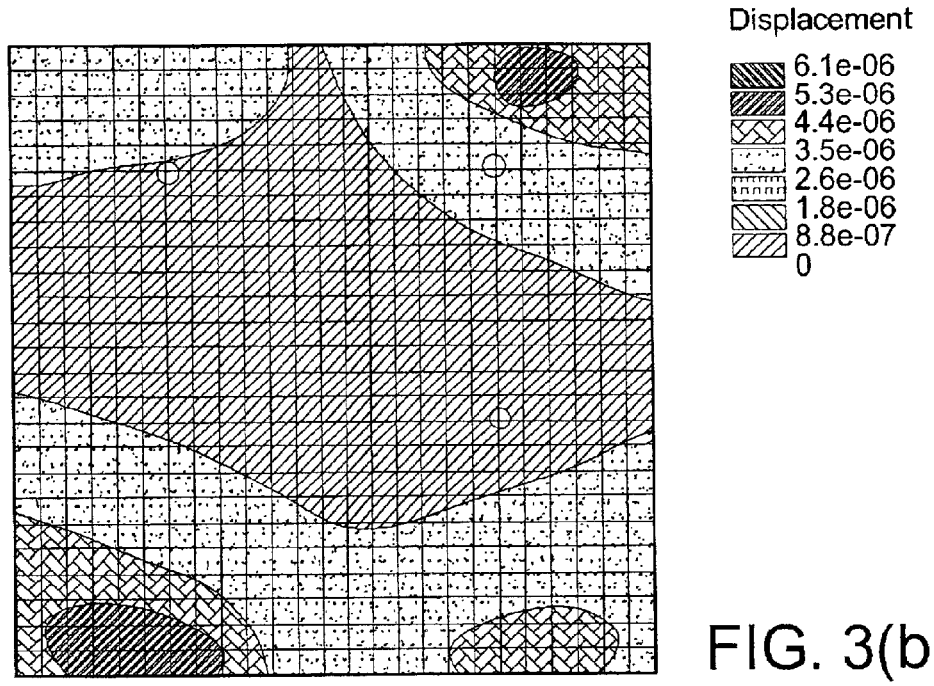
FIG. 3(b) illustrates a plot of the in-plane surface displacements (in inches) for a mask with the loads computed using a finite-element linear-stress analysis code.

Another exemplary analytical solution to the problem of determining the required strains uses finite-element linear-stress-analysis (FEA) to simulate the behavior of the mask substrate when subjected to externally applied forces, i.e. the actuators. FEA computations on a 5'×5×0.090' thick fused-silica mask (exemplary elastic modulus=$1.04 \times 10^7$ lb/in$^2$, exemplary Poisson's ratio=0.17) loaded on its edges with the forces shown in FIG. 3(a) have been carried out. A plot of the in-plane surface displacements from a simulation that exactly reproduced the measured x and y offsets at the three sites shown in FIG. 2(b) is shown in FIG. 3(b). Not surprisingly, the results from the analytical solution to the six simultaneous equations and those from the FEA simulation are quite similar. The only differences are in areas of the mask 16 near the piezoelectric actuators 12 (lying outside of the patterned area) and are a result of the overly simplistic boundary conditions assumed in the analytical solution.

It is also noted that the two techniques described above could be used together. For example, the simultaneous equations can be solved and the results used as a starting condition for the FEA, which is usually faster if the starting conditions are close to the desired solution.

The above analysis was conducted using known misalignment measurements at three sites in the chip. If not all chips are measured individually, then the misalignment can be extrapolated from measurements on surrounding chips.

In order to reduce the misalignment, the first step is to measure the misalignment at a number of alignment mark locations, use that information to re-position the wafer, and deform the mask to compensate for image and wafer distortion, before the exposure is made. When employing such a strategy, a new set of voltages is applied to the piezoelectric actuators 12 before each chip is exposed. Piezoelectric actuators 12 may be subject to hysteresis when the voltages are changed and to drift when a constant voltage is applied. In order to improve accuracy and predictability, the piezoelectric actuators 12 may be equipped with auxiliary devices, such as strain gauges.

Figure 4:
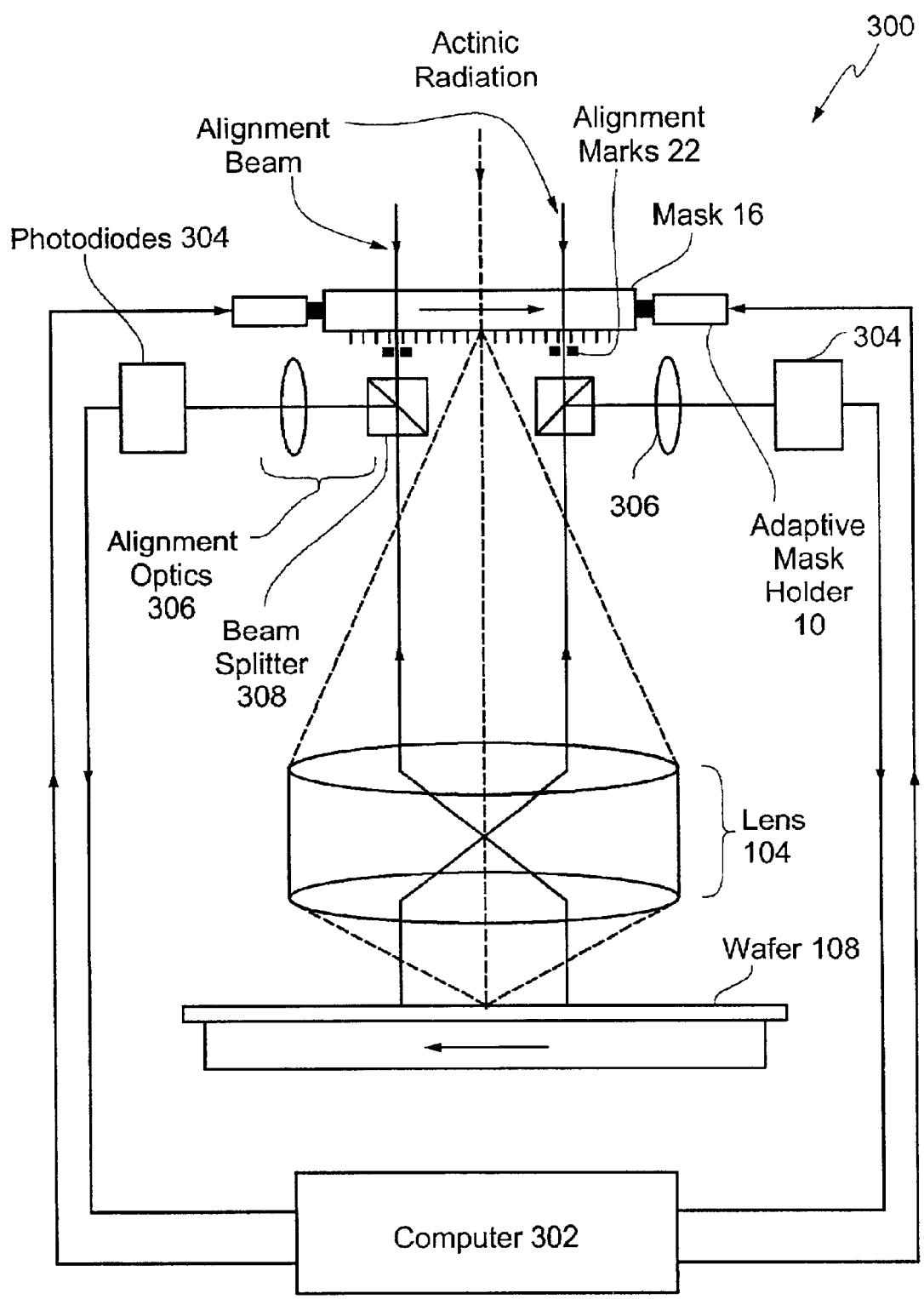
FIG. 4 illustrates a block diagram of a through-the-lens alignment metrology system for a step-and-scan projection lithography tool.

If alignment measurements could be made in real time, i.e. during exposure or so shortly before exposure that the piezoelectric actuators did not have time to drift, the piezoelectric actuators 12 would be less expensive and the whole alignment system would have a faster response time. To accomplish this, a through-the-lens alignment metrology system may be employed, as illustrated in FIG. 4, to monitor the misalignment just before and just after a point on the mask is exposed. Two or more alignment tools may be used simultaneously to obtain sufficient data. In this case, all of the alignment marks on the wafer could be utilized without increasing the measurement time.

As illustrated, the through-the-lens alignment metrology system 300 of FIG. 4 includes a compound projection lens 104, a wafer 108, and the mask 16. It is noted that the compound projection lens 104 may be a complex lens made up of several optical elements, including lenses and is not limited to the exemplary dual lens arrangement illustrated in FIG. 4. The through-the-lens alignment metrology system 300 may also include alignment optics 306. It is noted that the alignment optics 306 may include a beam splitter 308. It is also noted that the arrows on the mask 16 and the wafer 108 of FIG. 4 indicate the use of a scanner, in which the mask 16 and/or wafer 108 are moving in opposite directions during exposure.

The through-the-lens alignment metrology 300 provides more accurate alignment because all of the misalignment data comes from direct measurements not from extrapolations. A real-time through-the-lens alignment system 300 should be faster (alignment measurements can be made during exposure), more accurate (no interpolated alignment data is used) and cheaper (no need to correct for hysteresis and drift in the piezoelectric actuators 12).

If light at the actinic wavelength is used for alignment, there will be no chromatic aberration in the projection lens 104 and an alignment mark 22 on the mask 16 will be in focus at the wafer 108. However, in this case, there is danger that the alignment light will expose the resist. This problem can be reduced if the alignment light is turned on only when alignment marks 22 pass beneath the alignment optics (in a scanning system) or if the intensity of the alignment light is small compared to the exposure light. If the alignment light is not at the actinic wavelength, but the projection lens 104 is almost achromatic (as is the case with the catadioptric lens present in a SVG Lithography Microscan Tool), compensating optics can be employed to achromatize the alignment system 300. Alternatively, the alignment system 300 may employ a light path that goes around the projection lens 104. In this case, the alignment light can be at any wavelength.

It is noted that the beam splitters 308 should not extend into the lithographic image field and therefore cast a destructive shadow on the wafer 108. The lithographic field is the region that has the highest resolution, for example, 0.18 microns in a projector. The alignment marks 22 are usually made of coarser lines, for example, 0.3 microns, and can thus be used in the region of the lens adjacent to the lithographic image field which still has adequately high resolution for these coarser features.

The mask-to-wafer alignment system 300 may also include a computer 302 and photodiodes 304. A through-the-lens alignment metrology system 300, such as the one illustrated in FIG. 4, may also be used to monitor the misalignment between the mask image and the wafer in near real time, just before and just after a slit-shaped region on the mask is exposed. In practice, there may be several alignment marks 22 in the direction of the rectangular or in some cases arc-shaped region being exposed. The results of the alignment measurements are fed to the computer 302 which calculates the voltages to apply to the actuators 12 in the adaptive mask holder 10 that deforms the mask 16 so that it compensates for the wafer distortion and brings all of the alignment marks 22 in the exposed area into substantial registration simultaneously. Since only roughly 15% of the mask area is being imaged at any instant, the alignment accuracy in such a system 300 is better than in one that employs a step-and-repeat strategy because fewer compromises need to be made in the alignment. Since it takes tens of milliseconds for a point on the mask to cross the region being scanned, and a time constant of the actuator 12 system may be in the millisecond range, there is time to make fine adjustments to the voltages on the actuators 12 on the fly.

Figure 5:
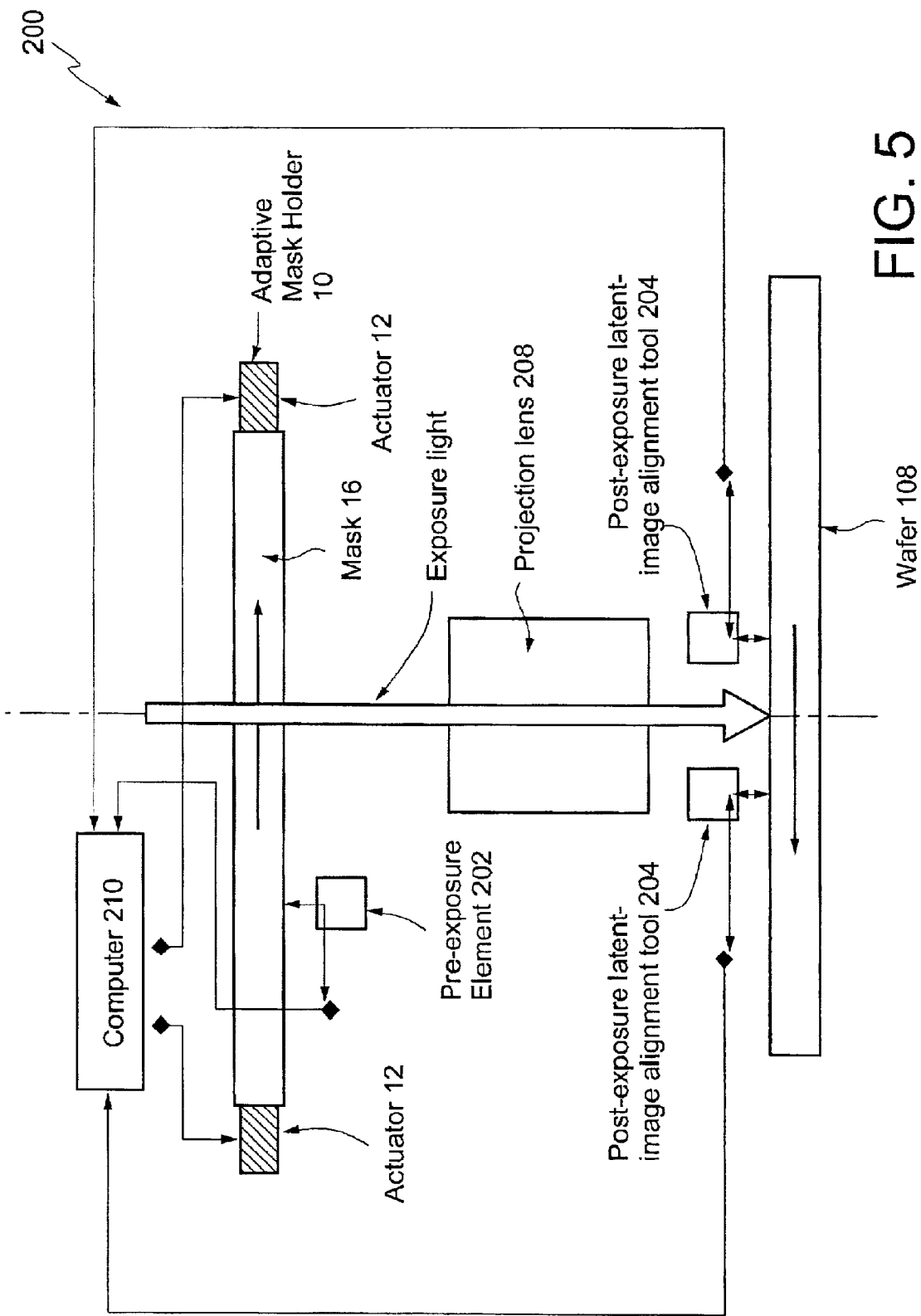
FIG. 5 illustrates a block diagram of a near-real-time latent-image (or around-the-lens) alignment metrology system for a step-and-scan projection lithography tool.

An alternative near-real-time alignment metrology system 200 that exploits the fact that actinic light produces a change in the index of refraction of a photoresist on the wafer 108 is shown in FIG. 5. The near-real-time alignment metrology system 200 may include a pre-exposure alignment metrology system, a post-exposure alignment metrology system 204, the adaptive mask holder 10, a projection lens 208, and a computer 210. The pre-exposure alignment metrology system may include pre-exposure element 202 that reads the position of the mask 16 relative to the projection lens 208 and pre-exposure element 203 that reads the position of the wafer 108 relative to the projection lens 208. Using this information a computer moves the mask 16 and/or wafer 108 into position for accurate alignment. The post-exposure alignment system 204 measures how accurately the image was projected, and thereby recalibrates the mask-wafer pre-exposure alignment system. The alignment metrology system 200 of FIG. 5 does not go through the projection lens 208, and is therefore termed an around-the-lens metrology system. The pre-exposure alignment metrology system 202 at the mask 16 (and/or wafer 108) feeds information to the adaptive mask holder 10 to correct the mask region that is about to be exposed. A post-exposure alignment metrology system 204 that can see the latent image on the wafer 108 measures the actual alignment immediately after the exposure and produces information that is used to fine tune the alignment. Such a near-real-time alignment metrology system 200 that is both fast and accurate increases throughput, and checks every exposure field so that interpolation is not needed and thus, would be more accurate than any off-line system.

Figure 6A:
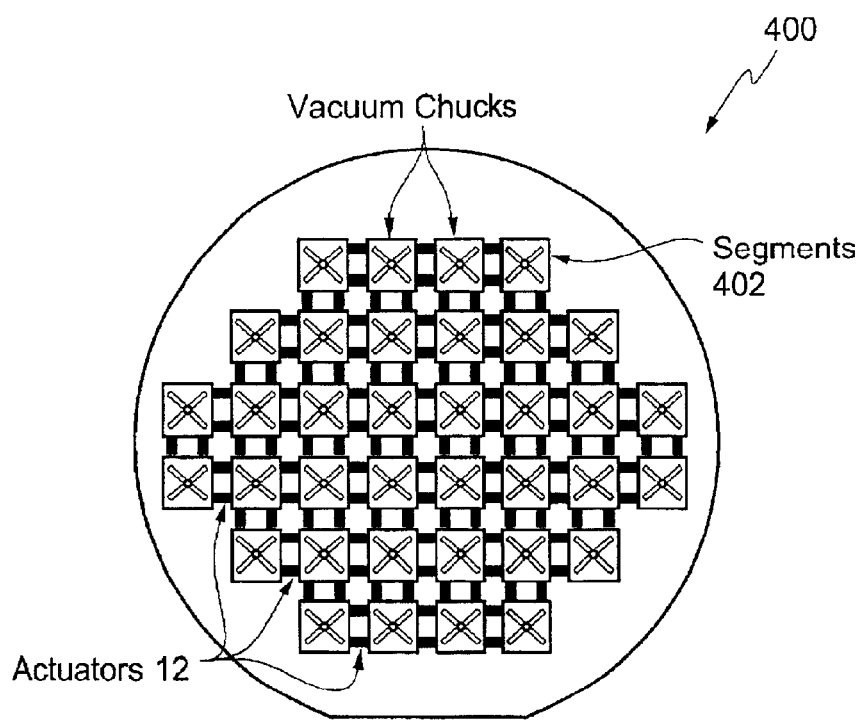
FIG. 6(a) illustrates a holder for a 6" silicon wafer comprised of a number of square segments, each with a cross sectional area of 0.5 in$^2$, with a vacuum port to hold the wafer and with two piezoelectric actuators per side.

The embodiments above teach deforming the mask 16 with an adaptive mask holder 10. This need not be the case; the wafer 108 could be deformed as well as the mask 16. An adaptive wafer holder 400, comprised of a number of square segments 402 each with a cross sectional area of 0.5 in$^2$ and with a vacuum port to hold the wafer 108, is shown in FIG. 6(a). Two piezoelectric actuators 12 per side allow each segment to be distorted in a variety of ways, from simple x and y displacements to complex changes in shape (magnification, shear, rotation, etc.). A finite-element linear-stress-analysis was used to simulate the behavior of a wafer 108 (exemplary elastic modulus=2.36×10$^7$ lb/in$^2$, exemplary Poisson's ratio=0.22) on the adaptive wafer holder 400. Simulation shows that the most uniform distribution of surface displacements on the wafer 108 was created by applying forces to all segments except those directly under the exposure site.

Figure 6B:
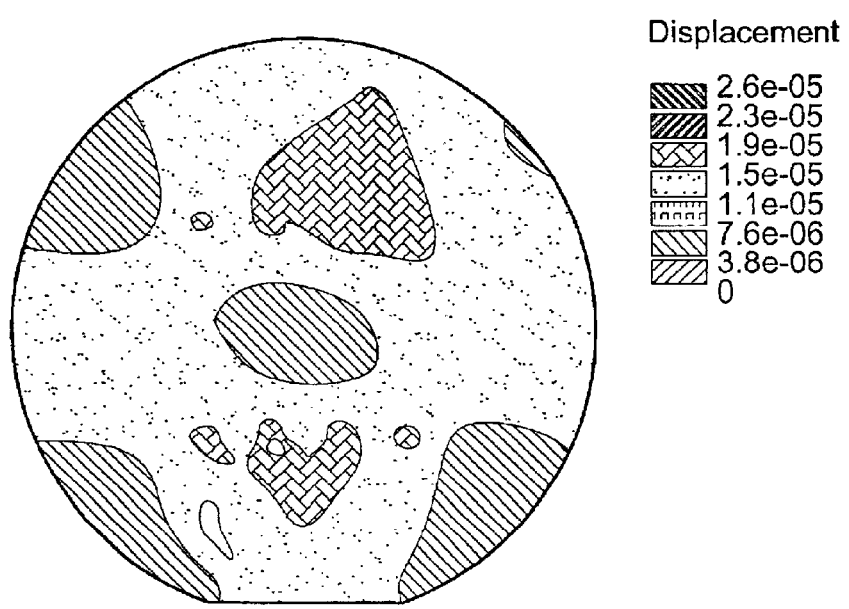
FIG. 6(b) illustrates a plot of the in-plane surface displacements (in inches) for a 6"×0.025" thick silicon wafer, computed using finite-element linear-stress-analysis (FEA), loaded to reproduce the x and y offset data provided in FIG. 2(c).

A plot of the in-plane surface displacements from a simulation that exactly reproduced the measured x and y offsets at the three sites shown in FIG. 2(b) is shown in FIG. 6(b). Even with a frictional coefficient of 1.0, the forces in some segments 402 were close to the maximum vacuum hold-down force (14.696 lb/in$^2$×0.5 in$^2$). As a result, larger wafer distortions may be accommodated with an adaptive mask-holder 10 than with an adaptive wafer-holder 400.

The adaptive mask holder 10 shown in FIG. 1 uses actuators 12 to apply force to one or more sides of a mask 16 to produce a controlled deformation of the mask 16 that cancels misalignment due to the distortion that is observed between the projected image of the mask 16 and an existing pattern on a wafer 108.

The distortion in the wafer 108 is measured by taking readings from a number of alignment marks 22 on the wafer 108. These alignment values are provided to a computer that calculates the forces that must be applied to the mask 16 to cancel the error. Several strategies to minimize the time required to take the readings have been discussed above. If real-time (or, through-the-lens) alignment is used, i.e. alignment measurements are made during exposure, all of the alignment marks on the wafer are used and one would expect better results than with systems that measure fewer marks and rely on interpolation between marks for much of the input data. Such a system of near-real-time measurements is expected to be especially valuable for commercial scanners.

It is noted that the mask 16 described above may be a photomask. It is further noted that the wafer 108 may be made of silicon. Further, the actuators described above may be piezoelectric actuators, electrostrictive actuators, magnetostrictive actuators, bimetallic actuators, thermal actuators or any other actuator known to those of ordinary skill or later developed could also be utilized. Still further, although the present invention may be used with features of any size, the present invention is particularly effective for features smaller than 100 nm. Still further, although the present invention is applicable to lithography systems, such as optical systems with optical elements, such as lenses, between the mask and the wafer, UV, deep UV, EUV, x-ray, and other lithography systems, the present invention is also applicable to imprint lithography systems, such as nano imprinting. Imprint lithography systems generally involve a mold and a wafer coated with an energy curable polymer. The polymer is cast by being placed in contact with the mold. The polymer is then cured and the mold removed. The pattern in the polymer is then transferred into the underlying substrate.

It is further noted that the adaptable mask holder of the present invention also works in an arrangement where a lead wafer is sent through a lithographic system, overlay is measured at a number of sites and interpolation is used to calculate the deformations required at the sites that are not directly measured.

As industry demands force the various lithographic systems to produce circuits with ever finer patterns and the overlay requirements become more stringent, lithographic methods of aligning the pattern of the mask with the pattern of the wafer may produce more errors and the yield (the percentage of products that actually operate) will decrease. This may lead to the popularization of imprinting techniques, such as nano imprinting.

It should be noted that the present invention may be used in a wide variety of different constructions encompassing many alternatives, modifications, and variations which are apparent to those with ordinary skill in the art. Accordingly, the present invention is intended to embrace all such alternatives, modifications, and variations as falling within the spirit and scope of the appended claims.

We claim:

1. A process for device fabrication comprising:
    inspecting a tool including a mask for long range error in one of either the mask or an image produced by the mask;
    determining deformation values to compensate for the long range errors; and
    deforming the mask using the determined deformation values to compensate for the long range errors.

2. The process of claim 1, wherein mask is imaged on the substrate by a projection lens.

3. The process of claim 1, wherein the mask is imaged on the substrate by projection printing.

4. The process of claim 3, wherein the projection printing includes one of optical, ultraviolet (UV), deep UV, extreme UV, and x-ray printing.

5. The process of claim 1, wherein the proximity of the mask to the wafer causes the image of the pattern on the mask to be transferred to the wafer.

6. The process of claim 5, wherein the mask is imaged on the wafer by nano imprinting.

7. The process of claim 5, wherein the mask is imaged on the wafer by contact printing.

8. The process of claim 1, wherein the long range errors are determined from alignment marks.

9. The process of claim 1, wherein the long range errors are determined by one of a through-the-lens alignment metrology system and an around-the-lens metrology system.

10. The process of claim 1, wherein the long range errors are caused by at least one of a mask writing error, mask strain, lens distortion, wafer distortion, stage error, previous levels of lithography, and chuck distortions.

11. The process of claim 1, wherein the deformation values are determined by one of solving simultaneous equations and finite-element linear-stress-analysis (FEA) or a combination thereof.

12. The process of claim 1, wherein the mask is deformed by applying voltages to at least one actuator.

13. The process of claim 12, wherein the actuators are piezoelectric ceramic, electrostrictive, or magnetostrictive.

14. A system for device fabrication, comprising:
a sub-system for inspecting a tool including a mask for long range errors in one of either the mask or an image produced by the mask;
a computer for determining deformation values to compensate for the long range errors; and
a holder for deforming the mask using the determined deformation values to compensate for the long range errors.

15. The system of claim 14, wherein the mask is imaged on a substrate by a projection lens.

16. The system of claim 14, wherein the mask is imaged on a substrate by projection printing.

17. The system of claim 16, wherein the projection printing includes one of optical, ultraviolet (UV), deep UV, extreme UV, and x-ray printing.

18. The system of claim 14, wherein the proximity of the mask to the wafer causes the image of the pattern on the mask to be transferred to the wafer.

19. The system of claim 18, wherein the mask is imaged on the wafer by nano imprinting.

20. The system of claim 18, wherein the mask is imaged on the wafer by contact printing.

21. The system of claim 14, wherein the long range errors are determined from alignment marks.

22. The system of claim 14, wherein the long range errors are determined by one of a through-the-lens alignment metrology system and an around-the-lens metrology system.

23. The system of claim 14, wherein the long range errors are caused by at least one of a mask writing error, mask strain, lens distortion, wafer distortion, stage error, previous levels of lithography, and chuck distortions.

24. The system of claim 14, wherein the deformation values are determined by one of solving simultaneous equations and finite-element linear-stress-analysis (FEA) or a combination thereof.

25. The system of claim 14, wherein the the mask is deformed by applying voltages to at least one actuator.

26. The system of claim 25, wherein the actuators are piezoelectric ceramic, electrostrictive, or magnetostrictive.

27. A holder, comprising:
a frame in which a mask or substrate may be placed; and
at least one actuator between the frame and the mask, for receiving at least one deformation value for canceling a long range error from at least one of a plurality of sources between the projected image of the mask and an existing pattern on the substrate and for deforming the mask in accordance with the at least one deformation value to substantially realign the projected image of the mask and the existing pattern on the substrate.

28. The holder of claim 27, wherein the at least one actuator is piezoelectric ceramic, electrostrictive, or magnetostrictive.

29. The holder of claim 27, further comprising a buffer block wherein said buffer block and said at least one actuator meet at a contact point.

30. The holder of claim 27, wherein the long range error is caused by at least one of a mask writing error, mask strain, lens distortion, wafer distortion, stage error, previous levels of lithography, and chuck distortions.

31. The holder of claim 27, wherein said at least one actuator is opposed by another actuator.

32. The holder of claim 27, wherein said at least one actuator is opposed by a stud or pin.

33. A process for device fabrication comprising:
inspecting a tool including a mask for long range errors in one of either the mask or an image produced by the mask;
determining deformation values to compensate for the long range errors; and
deforming the mask and a substrate in an image plane of the tool using the determined deformation values to compensate for the long range errors.

34. A system for device fabrication, comprising:
a sub-system for inspecting a tool including a mask for long range errors in one of either the mask or an image produced by the mask;
a computer for determining deformation values to compensate for the long range errors;
a first holder for deforming the mask using the determined deformation values to compensate for the long range errors; and
a second holder for deforming the substrate in an image plane of the tool using the determined deformation values to compensate for the long rage errors.

35. A holder, comprising:
a frame in which a mask may be placed; and
a plurality of actuators, for receiving at least one deformation value for canceling a long range error from at least one of a plurality of sources between the projected image of the mask and an existing pattern on a substrate and for deforming the mask and the substrate in accordance with the at least one deformation value to substantially realign the projected image of the mask and the existing pattern on the substrate.

* * * * *